(12) United States Patent
Mao et al.

(10) Patent No.: US 9,041,034 B2
(45) Date of Patent: May 26, 2015

(54) LIGHT EMITTING DIODE COMPONENT COMPRISING POLYSILAZANE BONDING LAYER

(75) Inventors: Guoping Mao, Woodbury, MN (US); Stephen J. Znameroski, Eagan, MN (US); Yu Yang, Eden Prairie, MN (US); Terry L. Smith, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/876,373

(22) PCT Filed: Oct. 25, 2011

(86) PCT No.: PCT/US2011/057635
§ 371 (c)(1),
(2), (4) Date: Mar. 27, 2013

(87) PCT Pub. No.: WO2012/067766
PCT Pub. Date: May 24, 2012

(65) Prior Publication Data
US 2013/0221393 A1    Aug. 29, 2013

Related U.S. Application Data

(60) Provisional application No. 61/415,115, filed on Nov. 18, 2010.

(51) Int. Cl.
*H01L 33/00* (2010.01)
*H01L 33/50* (2010.01)
*H01L 33/44* (2010.01)

(52) U.S. Cl.
CPC ........... *H01L 33/502* (2013.01); *H01L 33/0079* (2013.01); *H01L 33/44* (2013.01); *H01L 2933/0025* (2013.01); *H01L 2933/0041* (2013.01); *H01L 2924/0002* (2013.01)

(58) Field of Classification Search
USPC ........ 257/79, 98, 753, 783, E33.001, E33.06, 257/E33.064; 438/31, 35, 38, 118
See application file for complete search history.

(56) References Cited

U.S. PATENT DOCUMENTS

| | | | |
|---|---|---|---|
| 3,519,516 | A | 7/1970 | Yakovlevich |
| 4,642,126 | A | 2/1987 | Zador |

(Continued)

FOREIGN PATENT DOCUMENTS

| | | |
|---|---|---|
| JP | 2005-294820 | 10/2005 |
| JP | 2007-042686 | 2/2007 |

(Continued)

OTHER PUBLICATIONS

Kroke et al., "Silazane Derived Ceramics and Related Materials", Materials Science and Engineering, 26 (2000), pp. 97-199.

(Continued)

*Primary Examiner* — Su C Kim
(74) *Attorney, Agent, or Firm* — Carolyn A. Fischer

(57) ABSTRACT

In one embodiment, a semiconductor component, such as a wavelength converter wafer, is described wherein the wavelength converter is bonded to an adjacent inorganic component with a cured bonding layer comprising polysilazane polymer. The wavelength converter may be a multilayer semiconductor wavelength converter or an inorganic matrix comprising embedded phosphor particles. In another embodiment, the semiconductor component is a pump LED component bonded to an adjacent component with a cured bonding layer comprising polysilazane polymer. The adjacent component may the described wavelength converter(s) or another component comprised of inorganic material(s) such as a lens or a prism. Also described are methods of making semiconductor components such as wavelength converters and LED's.

24 Claims, 2 Drawing Sheets

(56) References Cited

U.S. PATENT DOCUMENTS

| | | | |
|---|---|---|---|
| 4,652,274 | A | 3/1987 | Boettcher |
| 5,457,151 | A | 10/1995 | Graef |
| 5,545,676 | A | 8/1996 | Palazzotto |
| 5,801,073 | A * | 9/1998 | Robbins et al. ............... 438/125 |
| 5,807,954 | A | 9/1998 | Becker |
| 6,657,236 | B1 | 12/2003 | Thibeault |
| 6,756,731 | B1 * | 6/2004 | Sano ............................ 313/499 |
| 7,297,374 | B1 | 11/2007 | Arney |
| 7,402,831 | B2 | 7/2008 | Miller |
| 7,541,610 | B2 | 6/2009 | Haase |
| 7,576,365 | B2 | 8/2009 | Mitani |
| 7,879,258 | B2 | 2/2011 | De Graaf |
| 2002/0004180 | A1 * | 1/2002 | Hotta et al. .................. 430/311 |
| 2002/0113241 | A1 | 8/2002 | Kubota |
| 2006/0001056 | A1 | 1/2006 | Saxler |
| 2008/0013177 | A1 * | 1/2008 | Hatano et al. ................ 359/586 |
| 2008/0308828 | A1 | 12/2008 | Kashiwagi |
| 2010/0230691 | A1 * | 9/2010 | Inoue et al. .................... 257/98 |
| 2010/0283074 | A1 | 11/2010 | Kelley |

FOREIGN PATENT DOCUMENTS

| | | |
|---|---|---|
| WO | WO 2006/097876 | 9/2006 |
| WO | WO 2008/083188 | 7/2008 |
| WO | WO 2009/048704 | 4/2009 |
| WO | WO 2010/024981 | 3/2010 |

OTHER PUBLICATIONS

Riedel, et al., "Silicon-Based Polymer-Derived Ceramics Synthesis Properties and Applications—A Review", Journal of the Ceramic Society of Japan, 114 [6] pp. 425-444 (2006).

Birot et al., "Comprehensive Chemistry of Polycarbosilanes, Polysilazanes, and Polycarbosilazanes as Precursors of Ceramics" Chemical Review, (1995) 95, pp. 1443-1477.

Li et al., "Novel Transparent Polysilazane Glass: Synthesis and Properties", Advanced Engineering Materials (2000) vol. 2, No. 5, pp. 290-293.

Lee et al., "Fabrication of Microfluidic Channels Derived From a UV/Thermally Cured Preceramic Polymer Via a Soft Lithographic Technique" Microelectric Engineering (2007) 84, pp. 2892-2895.

Ohishi, "Gas barrier characteristics of a polysilazane film formed on an ITO-coated PET substrate", Journal of Non-Cyrstalline Solids 330 (2003) pp. 248-251.

Reddy et al., "Polymer-Derived Ceramic Materials from Thiol-ene Photopolymerizations" Chem. Mater. (2003) 15, 4257-4261.

KiON Specialty Polymers: Product List: Acrylic Hybrid; Acrylic Hybrid 1055; Heat-Curable Polysilazane-based Acrylic Coating, [printed from internet on May 11, 2011] <http://www.kioncorp.com/productlist/acrylichybrid.html>, 1 page.

Roelkens et al., "Adhesive Bonding of III-V Dies to Processed SOI Using BCB for Photonic Applications" undated, Dept. of Information Technology, Ghent University, Sint-Pietersnieuwstraat 41, B-9000 Ghent, Belgium, 6 pgs.

Peng et al., "Performance of InGaN-GaN LEDs Fabricated Using Glue Bonding on 50-mm Si Substrate", IEEE Photonics Technology Letters, vol. 18, No. 4, Feb. 2006, 613-615.

Summary Specifications for 3M™ Flexible Circuits, Undated, 1 page.

Kasugai et al., "Light Extraction Process in Moth-Eye Structure", Phys. Stat. Sol. vol. 3, No. 6, 2165-2168 (2006).

International Search Report PCT/US2011/057635; May 14, 2012, 4 pgs.

* cited by examiner

LIGHT EMITTING DIODE COMPONENT COMPRISING POLYSILAZANE BONDING LAYER

BACKGROUND

Wavelength converted light emitting diodes (LEDs) are becoming increasingly important for illumination applications where there is a need for light of a color that is not normally generated by an LED, or where a single LED may be used in the production of light having a spectrum normally produced by a number of different LEDs together. One example of such an application is in the back-illumination of displays, such as liquid crystal display (LCD) computer monitors and televisions. In such applications there is a need for substantially white light to illuminate the LCD panel. One approach to generating white light with a single LED is to first generate blue light with the LED and then to convert some or all of the light to a different color. For example, where a blue-emitting LED is used as a source of white light, a portion of the blue light may be converted using a wavelength converter to yellow light. The resulting light, a combination of yellow and blue, appears white to the viewer.

In some approaches, the wavelength converter is a layer of semiconductor material that is placed in close proximity to the LED, so that a large fraction of the light generated within the LED passes into the converter. WO2009/048704 describes a light emitting diode (LED) that includes a wavelength converter for converting the wavelength of light emitted by the LED. A bonding layer attaches the LED wafer to the wavelength converter. Another approach is direct wafer bonding of the semiconductor wavelength converter to the semiconductor material of the LED die.

SUMMARY OF THE INVENTION

One approach to manufacture wavelength converted LED's is to produce a plurality of LED semiconductor layers for multiple devices on a common substrate, that are subsequently separated into individual devices by use, for example, of a wafer saw. The wavelength converter may be bonded to a cover glass, prior to bonding the wavelength converter to the LED semiconductor layers. Typically silicone adhesives have been used for this purpose due to its superior optical clarity and excellent thermal stability. However, it has been found that such silicone adhesives do not cut cleanly during dicing with the wafer saw. Accordingly, industry would find advantage is alternative adhesives that address such problem without compromising the desired optical properties.

In one embodiment, a semiconductor component, such as a wavelength converter wafer, is described wherein the wavelength converter is bonded to an adjacent inorganic component with a cured bonding layer comprising polysilazane polymer. The wavelength converter may be a multilayer semiconductor wavelength converter or an inorganic matrix comprising embedded phosphor particles.

In another embodiment, the semiconductor component is a pump LED component bonded to an adjacent component with a cured bonding layer comprising polysilazane polymer. The adjacent component may the described wavelength converter(s) or another component comprised of inorganic material(s) such as a lens or a prism.

Also described are methods of making semiconductor components such as wavelength converters and LED's.

In each of these embodiments, the bonding layer may comprise polysilazane polymer alone or a mixture further comprising a free-radically polymerizable monomer such as a (meth)acrylate monomer. Compositions comprising a (meth)acrylate monomer can advantageously be radiation cured to maintain the positioning of the assembled components prior to completion of curing by thermal curing. Provided that the bonding layer comprises a relatively low concentration of free-radically polymerizable (e.g. (meth) acrylate) monomer(s), the optical clarity and thermal stability properties of the polysilazane material are not substantially compromised.

In view of such favored properties, bonding layers comprising polysilazane polymer is surmised to be suitable for use as an optical adhesive for other light-transmissive inorganic component of electronic illuminated display devices.

BRIEF DESCRIPTION OF THE DRAWINGS

The invention may be more completely understood in consideration of the following detailed description of various embodiments of the invention in connection with the accompanying drawings, in which.

Figure 1:
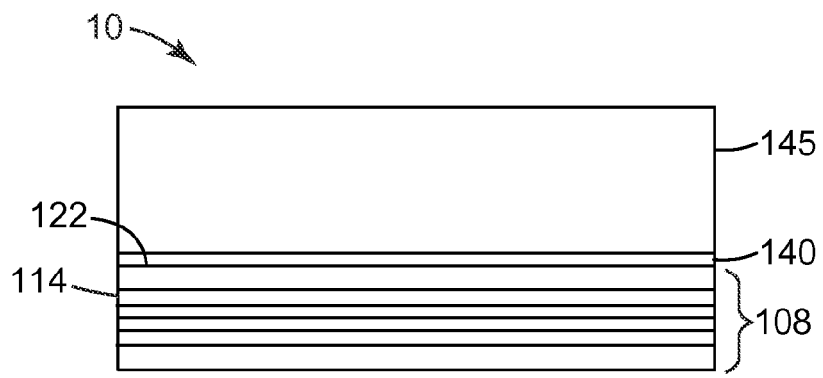
FIG. 1 schematically illustrates an embodiment of a multilayer semiconductor wavelength converter wafer bonded to a cover glass.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to bonding semi-conductor layers such as wavelength converters, light emitting diodes (LEDs), and other light-transmissive inorganic components.

As used herein "wavelength converter" refers to a component that converts wavelengths of at least a portion of the light emitted by the LED to a different, typically longer, wavelength. The wavelength converter may be a multilayer semiconductor wavelength converter or an inorganic matrix comprising embedded phosphor-particles. WO 2006/097876 and WO2010/024981, both incorporated herein by reference; describe illustrative wavelength converters comprising a ceramic matrix comprising embedded phosphor particles. Such wavelength converters may also be referred to as luminescent ceramic matrix composites.

In favored embodiments, the wavelength converter converts light at the blue or UV portion of the spectrum into longer wavelengths of the visible or infrared spectrum, so the emitted light may appear to be, for example, green, yellow, amber, orange, or red, or, by combining multiple wavelengths, the light may appear to be a mixed color such as cyan, magenta or white. For example, an AlGaInN LED that produces blue light may be used with a wavelength converter that absorbs a portion of the blue light to produce longer wavelengths such as yellow light, with the result that the combination of blue and yellow light appears to be white.

More particularly, in some embodiments, the bonding of a multilayer semiconductor wavelength converter using a polysilazane bonding layer is described. One suitable type of semiconductor wavelength converter 108 (See FIG. 1) is described in U.S. patent application Ser. No. 11/009,217 incorporated herein by reference. A multilayered wavelength converter typically employs multilayered semiconductor structures (e.g. quantum well structures) comprising II-VI semiconductor materials, for example various metal alloy selenides such as CdMgZnSe. In such multilayered wavelength converters, the quantum well structure 114 is engineered so that the band gap in portions of the structure is selected so that at least some of the pump light emitted by the LED (102 of FIG. 2) is absorbed. The charge carriers generated by absorption of the pump light move into other portions of the structure having a smaller band gap, the quantum well layers, where the carriers recombine and generate light at the longer wavelength. This description is not intended to limit the types of semiconductor materials or the multilayered structure of the wavelength converter.

An example of (e.g. multilayer semiconductor) wavelength converter wafer bonded to a glass cover sheet with a cured polysilazane bonding layer is depicted in FIG. 1. The component 10 includes a semiconductor wavelength converter 108 attached to an inorganic light-transmissive (e.g. glass) cover sheet 145 with a cured polysilazane bonding layer 140.

Figure 2:
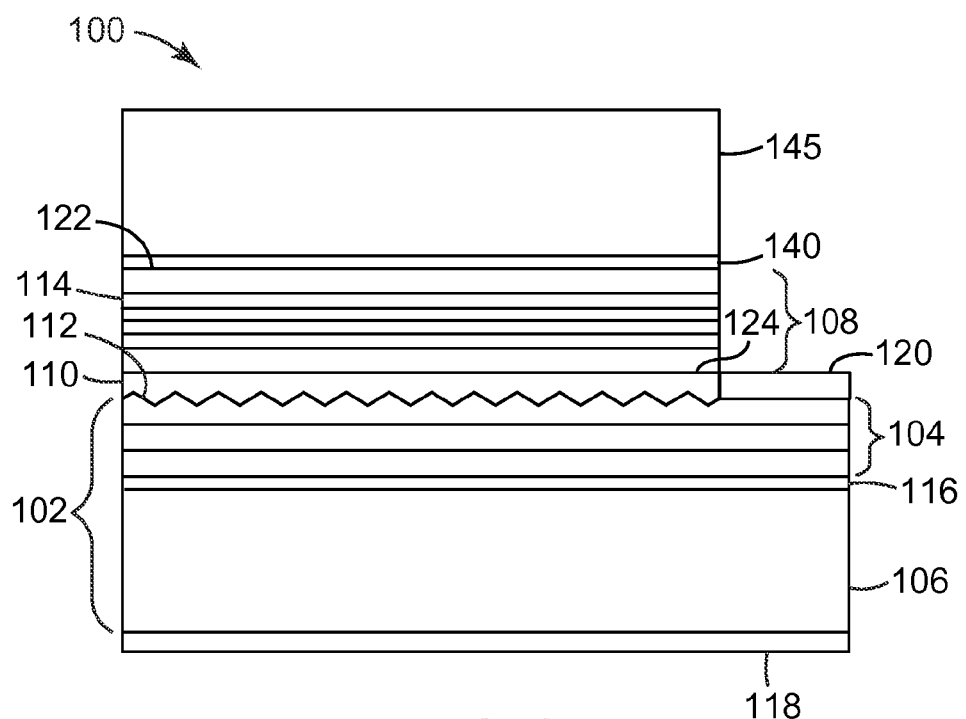
FIG. 2 schematically illustrates an embodiment of a wavelength-converted light emitting diode (LED)

An example of a wavelength-converted LED device 100 according to a first embodiment of the invention is schematically illustrated in FIG. 2. The device 200 includes an LED 102 that has a stack of LED semiconductor layers 104 on an LED substrate 106. The LED semiconductor layers 104 may include several different types of layers including, but not limited to, p- and n-type junction layers, light emitting layers (typically containing quantum wells), buffer layers, and superstrate layers. LED semiconductor layers 104 generally comprise III-V semiconductor materials.

The LED semiconductor layers 104 are sometimes referred to as epilayers due to the fact that they are typically grown using an epitaxy process. The LED substrate 106 is generally thicker than the LED semiconductor layers, and may be the substrate on which the LED semiconductor layers 104 are grown or may be a substrate to which the semiconductor layers 104 are attached after growth, as will be explained further below.

The upper and lower surfaces 122 and 124 of the semiconductor wavelength converter 108 may include different types of coatings, such as light filtering layers, reflectors or mirrors, for example as described in U.S. patent application Ser. No. 11/009,217. The coatings on either of the surfaces 122 and 124 may include an anti-reflection coating.

In some embodiments, semiconductor wavelength converter 108 is attached to the upper surface 112 of the LED 102 via a bonding layer 110. Thus, bonding layer 110 bonds the wavelength converter 108 to the LED 102. Provided that LED 102 can withstand thermal curing at temperatures necessary to thermally cure a polysilazane adhesive, bonding layer 110 may alternatively or in combination with bonding layer 140, comprise a cured polysilazane bonding layer.

The bonding layers, and in particular the bonding layer 140 between the wavelength converter and inorganic light-transmissive cover sheet comprises a curable polysilazane composition. The curable polysilazane composition functions as an optical adhesive.

As used herein, "polysilazane" refers to compounds having at least one of a linear, branched, or cyclic backbone comprising at least one Si—N linkage; these compounds comprise at least one ethylenically-unsaturated group or a SiH group. For simplicity, in this application, "polysilazane" also includes "polysiloxazane" and "polyureasilazane". "Polysiloxazane" refers to compounds having at least one of a linear, branched, or cyclic backbone comprising both Si—N and Si—O linkages. "Polyureasilazane" refers to compounds having at least one linear, branched, or cyclic backbone comprising at least one Si—N linkage and having at least one carbonyl group bonded to each of two nitrogen atoms. Polysilazane polymers are distinguished from polysiloxane polymers in that although the backbone of a polysiloxane comprises Si—O linkages, polysiloxanes lack Si—N linkages.

Polysilazane polymers are known such as described in U.S. Pat. No. 7,297,374; incorporated herein by reference.

Useful polysilazanes, all of which can be random, alternating, or block polymers, include those linear polysilazanes generally represented by Formula I,

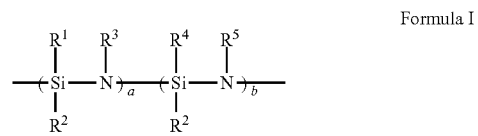

Formula I wherein $R^1$ and $R^2$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, taken together, may form a ring having less that 8 carbon atoms; $R^3$ and $R^5$ are independently H, a linear or branched alkyl group having less than 7 carbon atoms, or a linear or branched heteroalkyl group having less than 7 carbon atoms; $R^4$ is H or an ethylenically unsaturated group; a and b represent mole fractions such that the sum of a and b is 1, b is greater than zero, and preferably a is greater than b. The number average molecular weight of the polysilazanes of Formula I can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Examples of useful cyclic polysilazanes include those generally represented by Formula II,

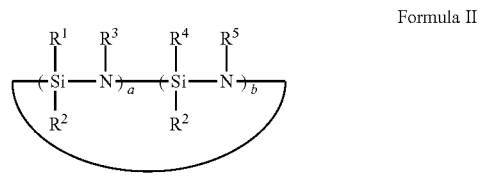

Formula II wherein $R^1$, $R^2$, $R^3$, $R^4$, $R^5$, a, and b are as described for the polysilazanes of Formula I. The number average molecular weight of the cyclic polysilazanes of Formula II can range from about 160 g/mol to about 3,000 g/mol, preferably from about 300 g/mol to about 2000 g/mol, and more preferably from about 350 g/mol to about 1500 g/mol. Examples of other useful cyclic polysilazanes include those that include both linear and cyclic polysilazanes moieties.

Examples of useful branched polysilazanes also include those generally represented by Formula I (linear polysilazanes with branches) or Formula II (cyclic polysilazanes with branches) where either or both of $R^1$ and $R^2$ in at least one or more of the repeat units of the polysilazanes have the structure represented by Formula III

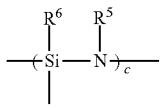

Formula III wherein $R^5$ is as described for Formula I, $R^6$ is H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, and c represents a mole fraction such that the sum of a, b, and c is 1, b is greater than zero, preferably b is greater than c, c is greater than zero, and preferably a is greater than b. The number average molecular weight of the branched polysilazanes can range from about 160 g/mol to about 3,000 g/mol, preferably from about 300 g/mol to about 2000 g/mol, and more preferably from about 350 g/mol to about 1500 g/mol. Examples of other useful branched polysilazanes include those that include multiple branches and those that include cyclic polysilazane moieties.

Polysilazanes that include Si—O units in addition to Si—N units are called polysiloxazanes and are useful in the present invention.

Useful linear polysiloxazanes include those generally represented by Formula IV,

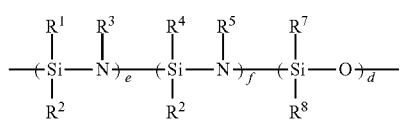

Formula IV wherein $R^1$, $R^2$, $R^7$, and $R^8$ are independently H, a linear, branched, or cyclic aliphatic group having less than 9 carbon atoms, a linear, branched, or cyclic heteroalkyl group having less than 7 carbon atoms, a substituted or unsubstituted aryl group having less than 13 carbon atoms, an ethylenically unsaturated group, or where $R^1$ and $R^2$, or $R^7$ and $R^8$, each pair independently taken together, form a ring having less than 8 carbon atoms; $R^3$ and $R^5$ are independently H, a linear or branched alkyl group having less than 7 carbon atoms, or a linear or branched heteroalkyl group having less than 7 carbon atoms; $R^4$ is H or an ethylenically unsaturated group; e, f, and d represent mole fractions such that the sum of e, f, and d is 1, f and d are each greater than zero, and preferably e is greater than both of f and d. The number average molecular weight of the polysiloxazanes of Formula IV can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Useful polysiloxazanes may be cyclic or branched. Useful cyclic polysiloxazanes include polysiloxazanes that have cyclic portions that include Si—O linkages and polysiloxazanes in which the Si—O linkages are not in the cyclic portion. Useful branched polysiloxazanes include polysiloxazanes that are branched at either or both the Si—N or the Si—O linkages.

A particularly useful commercially available polysilazane, KiON HTT1880 (available from KiON Corp (a unit of Clariant), Huntington Valley, Pa.), has the structure:

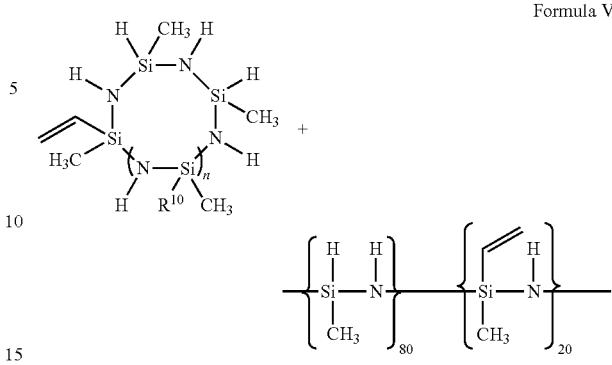

Formula V wherein n is an integer of 1-20, and $R^{10}$ can be H or a vinyl group.

Polysilazanes that include carbonyl groups that are bonded to each of two nitrogen atoms are called polyureasilazanes and are useful in the present invention.

Useful linear polyureasilazanes include those generally represented by Formula VI,

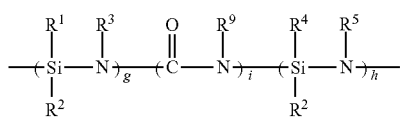

Formula VI wherein $R^1$, $R^2$, $R^3$, $R^4$, and $R^5$ are as described for the polysilazanes of Formula I, $R^9$ is H, a linear, branched, or cyclic aliphatic group having less than 7 carbon atoms, g, h, and i represent mole fractions such that the sum of g, h, and i is 1, both h and i are greater than zero, and preferably g is greater than h. The number average molecular weight of the polyureasilazanes of Formula VI can range from about 160 g/mol to about 10,000 g/mol, preferably from about 300 g/mol to about 7,000 g/mol, more preferably from about 500 g/mol to about 3,000 g/mol, and most preferably from about 700 g/mol to about 2,000 g/mol.

Useful cyclic polyureasilazanes include those generally represented by Formula VII,

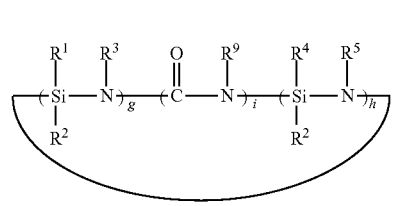

Formula VII wherein $R^1$, $R^2$, $R^3$, $R^4$, and $R^5$ are as described for the polysilazanes of Formula I and $R^9$ and g, h, and i are as described for the polyureasilazanes of Formula VI. The number average molecular weight of the cyclic polyureasilazanes of Formula VII can range from about 160 g/mol to about 3,000 g/mol, preferably from about 300 g/mol to about 2000 g/mol, and more preferably from about 350 g/mol to about 1500 g/mol. Examples of other useful cyclic polyureasilazanes include those that include both linear and cyclic polyureasilazanes moieties.

Examples of useful branched polyureasilazanes include those generally represented by Formula VI (linear polyureasilazanes with branches) or Formula VII (cyclic polyureasilazanes with branches) where either or both of $R^1$ and $R^2$ in at least one of the repeat units of the polyureasilazanes have the structure represented by Formula III as described above.

The optical adhesive or bonding layer optionally, further comprises at least one free-radically polymerizable monomer, oligomers or polymers, such as a (meth)acrylate monomer. The inclusion of a sufficient concentration of free-radically polymerizable monomer is amenable to providing an adhesive composition having dual curing mechanism, i.e. a combination of free-radically polymerizable moieties and thermally curable moieties. In the assembly of optical components, it is advantageous to first partially cure, by free-radical polymerization assembled components in order to maintain their assembled position for completion of curing by thermal curing. However, for other embodiments, the bonding layer may comprise polysilazane in the absence other free-radically polymerizable components such as (meth)acrylate monomers. Hence, the curable polysilazane bonding compositions are thermally curable and optionally cured or hardened using light.

Suitable (meth)acrylates are described, for example, by Palazzotto et al. in U.S. Pat. No. 5,545,676 at column 1, line 65, through column 2, line 26, the description of which is incorporated herein by reference and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200-500, copolymerizable mixtures of acrylated monomers such as those of U.S. Pat. No. 4,652,274, and acrylated oligomers such as those of U.S. Pat. No. 4,642,126, the descriptions of which are incorporated herein by reference. Suitable reactive polymers include polymers with pendant (meth)acrylate groups, for example, having from 1 to about 50 (meth)acrylate groups per polymer chain. Mixtures of two or more monomers, oligomers, and/or reactive acrylate polymers can be used if desired.

In favored embodiments, the (meth)acrylate monomer is a multi-(meth)acrylate monomer having 2 or more (meth)acrylate groups. The meth(acrylate)monomer preferably comprises 3, 4, 5 or more (meth)acrylate groups such as acrylate group.

Various multi-functional (meth)acrylate monomers are commercially available from Sartomer Company, Inc., Exton, Pa. such as a trifunctional acrylate ester (SR9012), trimethylolpropane triacrylate (SR351), pentaerythritol triacrylate (SR444), trimethylolpropane triacrylate (SR351LV), and dipentaerythritol pentaacrylate (SR399LV). For improved thermal stability, it is generally preferred to utilize multi-(meth)acrylate monomers lacking hydroxyl groups.

The inclusion of a small concentration of (meth)acrylate monomer or oligomer can render the adhesive composition partially curable by (e.g. ultraviolet) radiation curing as previously described. The concentration of (meth)acrylate monomer in the polysilazane optical adhesive or bonding layer is typically at least 2 wt-% or 3 wt-% based on the total wt-% solids of the adhesive composition or cured bonding layer. However, the inclusion of such can also reduce the thermal stability in comparison to polysilazane polymer alone. Hence, the concentration of (meth)acrylate monomer or oligomer is typically no greater than 15 wt-% or 10 wt-%.

The adhesive composition typically comprises at least one free-radical initiator to increase the rate of curing. Useful free-radical thermal initiators include for example, azo, peroxide, persulfate, redox initiators, and combinations thereof. Various thermal initiators are commercially available such as peroxide initiators commercially available from Arkema Inc, Philadelphia, Pa. under the trade designations "Luperox P" (t-butyl peroxybenzoate), "Luperox 233M75" (ethyl 3,3-di-(t-butylperoxy)butyrate), "Luperox 533M75" (ethyl 3,3-di-(t-amylperoxy)butyrate), and "Luperox TAP" (t-amyl peroxybenzoate). When the polysilazane bonding layer comprises a multifunctional (meth)acrylate monomer at a sufficient concentration such that the bonding layer can be partially cured by photocuring (prior to thermal curing), the polysilazane bonding layer typically further comprises a photoinitiator such as commercially available from Ciba Geigy under the trade designations "Darocur 1173", "Darocur 4265", "Irgacure 1800", Irgacure 369", Irgacure 1700" and "Irgacure 907"; and commercially available from BASF, Charlotte, N.C. under the trade designations "Lucirin TPO (2,4,6-trimethylbenzoy diphenyl phosphine oxide) and "Lucirin TPO-L" (ethyl-2,4,6-trimethylbenzoyl phenylphosphinate). The initiators can be used alone or in various combinations, at a concentration of about 0.1 to 10 weight percent.

Prior to using the polysilazane adhesive to bond semiconductor layers or other inorganic light-transmissive component, any volatiles present, such as $NH_3$ in the adhesive composition are removed since the presence thereof has been found to contribute voids or haze in the bonding layer. Such volatiles can be removed by various methods known in the art such as by allowing the adhesive composition to sit overnight in an enclosed glove box with a nitrogen atmosphere and/or by outgassing in a (e.g. room temperature) vacuum oven.

The polysilazane bonding material may be delivered to the surface of the a light-transmissive inorganic component such as a wavelength converter 208 or wavelength converter comprising an inorganic matrix comprising embedded phosphor particles, semiconductor layers of an LED (i.e. pump LED componentn), a (e.g. cover) glass, or to both, using any suitable method. Such methods include, but are not limited to, spin coating, knife coating, vapor coating, transfer coating, and other such methods such as are known in the art. In some approaches the bonding material may be applied using a syringe applicator.

Polysilazane materials are very sensitive to moisture and the curing is very sensitive to $O_2$ (radical curing). Therefore, the adhesive is preferably stored in a dry box and the adhesive is preferably applied in an inert environment as can be achieved by use of a nitrogen blanket.

The polysilazane materials are thermally cured and preferably partially cured by free-radical polymerization prior to thermal curing. The thermal curing of the polysilazane optical adhesive can be conducted at various temperatures. Curing temperatures no greater than 200° C., and preferably less than 175° C. or 150° C., generally do not degrade the II-IV semiconductor materials of the wavelength converter and LED.

The cured polysilazane bonding layer is generally thermally stable at for relatively long periods of time (e.g. 20,000 hours at 125° C.). Such thermal stability is evident under strong blue light illumination. The bond strength is sufficiently maintained in combination with good optical clarity, i.e. substantially no discoloration of the optical adhesive, such as yellowing. In favored embodiments, the polysilazane optical bonding layer exhibits adequate bond strength and good optical clarity after aging for 1, 2, 3, 4, or 5 weeks at high temperatures of at least 160° C., or 170° C., or 180° C., or 185° C.

Bonding layers 110 and 140 are substantially transparent such that most of the light passes through the bonded light-transmissive components, such as through the wavelength converter 108 and cover sheet 145 and/or through the LED 102 to the wavelength converter 108. For example greater than 90% of the light (e.g. emitted by the LED 102) may be transmitted through the bonding layer, as well as the light-transmissive inorganic components bonded by such. Bonding layers 110 and 140 are preferably colorless and have sufficient color stability such that the bonding layers do not generate color (e.g. yellow) upon aging.

To facilitate wafer dicing, bonding layers 110 and 140 are preferably prepared from a high modulus material. Optical adhesives comprising polysilazane polymer, as described herein, advantageously has a substantially higher modulus than polysiloxane adhesive compositions. Whereas polysiloxane adhesives typically have a storage modulus of about 2-3 MPa, polysilazane adhesive compositions typically have a storage modulus of at least about 1 gigapascal (GPa) or greater. Without intending to be bound by theory, it is surmised that the increase in modulus is related to clean cutting and the reduction of adhesive residue on the saw, etc. during mechanical separation into individual components (i.e. dies). In some embodiments, the cured polysilazane bonding layer, further comprising a (e.g. multifunctional) (meth)acrylate monomer, has a storage modulus of at least 2, 3 or 4 GigaPascals (GPa). In other embodiments, the polysilazane bonding layer comprises solely a polysilazane polymer, such as available from KION under the trade designation "HTT1880", and has a storage modulus of at least 5 or 6 GPa.

It is generally desirable to use a bonding layer 110 and optionally 140 that has a relatively high thermal conductance: the light conversion in the wavelength converter is not 100% efficient, and the resultant heat can raise the temperature of the converter, which may lead to color shifts and a decrease in the optical conversion efficiency. The thermal conductance can be increased by reducing the thickness of the bonding layer 110 and by selecting a bonding material that has a relatively high thermal conductivity. A further consideration in selection of the bonding material is the potential for mechanical stress created as a result of differential thermal expansion between the LED, the wavelength converter, and the bonding material. Two limits are contemplated. In the case where the coefficient of thermal expansion (CTE) of the bonding material is significantly different than the CTE of the LED 102 and/or wavelength converter 108, it is preferred that the bonding material be compliant, i.e. have a relatively low modulus, so that it can deform and absorb the stress associated with temperature cycling of the LED. The adhesive properties of the bonding layer 110 are sufficient to bond the LED 102 to the wavelength converter 108 throughout the various processing steps used in manufacturing the device, as is explained in greater detail below. In the case where the CTE difference between the bonding material and the LED 102 semiconductor layers is small, higher modulus, stiffer bonding materials may be used.

The bonding material 110 and optionally 140 may incorporate inorganic nanoparticles to enhance the thermal conductivity, reduce the coefficient of thermal expansion, or increase the average refractive index of the bonding layer. Examples of suitable inorganic particles include metal oxide particles such as $Al_2O_3$, $ZrO_2$, $TiO_2$, $ZnO$, $SnO_2$, and $SiO_2$. $SiO_2$ nanoparticles are generally preferred. Other suitable inorganic nanoparticles may include ceramics or wide bandgap semiconductors such as $Si_3N_4$, diamond, ZnS, and SiC. Suitable inorganic particles are typically submicron in size so as to allow formation of a thin bonding layer, and are substantially nonabsorbing over the spectral bandwidth of the emission LED and the emission of the wavelength converter layer. The size and density of the particles may be selected to achieve desired levels of transmission and scattering. The inorganic particles may be surface treated to promote their uniform dispersion in the bonding material. Examples of such surface treatment chemistries include silanes, siloxanes, carboxylic acids, phosphonic acids, zirconates, titanates, and the like.

Generally, polysilazane optical adhesives and other suitable materials for use in bonding layer 110 have a refractive index less than about 1.7, whereas the refractive indices of the semiconductor materials used in the LED and the wavelength converter are well over 2, and may be even higher than 3. Despite such a large difference between the refractive index of the bonding layer 110 and the semiconductor material on either side of the bonding layer 110, it has surprisingly been found that the structure illustrated in FIG. 1 provides excellent coupling of light from the LED 102 to the wavelength converter 108. Thus, the use of a bonding layer is effective at attaching the semiconductor wavelength converter to the LED without having a detrimental effect on extraction efficiency, and so there is no need to use a more costly method of attaching the wavelength converter to the LED, such as using direct wafer bonding.

Coatings may be applied to either the light-transmissive inorganic component, such as the cover sheet 145, wavelength converter 108, or LED 102 or to improve adhesion to the polysilazane bonding material and/or to act as antireflective coatings for the light generated in the LED 102. These coatings may include, for example, $TiO_2$, $Al_2O_2$, $SiO_2$, $Si_3N_4$ and other inorganic or organic materials. The coatings may be single layer or multi-layer coatings. surface treatment methods may also be performed to improve adhesion, for example, corona treatment, exposure to $O_2$ plasma and exposure to UV/ozone.

In some embodiments the LED semiconductor layers 104 are attached to the substrate 106 via an optional bonding layer 116, and electrodes 118 and 120 may be respectively provided on the lower and upper surfaces of the LED 102. Bonding layer 116 is typically a conductive metallic solder material. This type of structure is commonly used where the LED is based on nitride materials: the LED semiconductor layers 104 may be grown on a substrate, for example sapphire or SiC, and then transferred to another substrate 106, for example a silicon or metal substrate. In other embodiments the LED employs the substrate 106, e.g. sapphire or SiC, on which the semiconductor layers 104 are directly grown.

In some embodiments, as depicted in FIG. 2 and described in WO2009/048704; incorporated herein by reference, the upper surface 112 of the LED 102 is a textured layer that increases the extraction of light from the LED as compared to the upper surface 112 being flat. The texture on the upper surface may be in any suitable form that provides portions of the surface that are non-parallel to the semiconductor layers 104. For example, the texture may be in the form of holes, bumps, pits, cones, pyramids, various other shapes and combinations of different shapes, for example as are described in U.S. Pat. No. 6,657,236, incorporated herein by reference.

The texture may include random features or non-random periodic features. Feature sizes are generally submicron but may be as large as several microns. Periodicities or coherence lengths may also range from submicron to micron scales. In some cases, the textured surface may comprise a moth-eye surface such as described by Kasugai et al. in Phys. Stat. Sol. Volume 3, page 2165, (2006) and US patent Publication No. US2006/0001056.

A surface may be textured using various techniques such as etching (including wet chemical etching, dry etching processes such as reactive ion etching or inductively coupled plasma etching, electrochemical etching, or photoetching), photolithography and the like. A textured surface may also be fabricated through the semiconductor growth process, for example by rapid growth rates of a non-lattice matched composition to promote islanding, etc. Alternatively, the growth substrate itself can be textured prior to initiating growth of the LED layers using any of the etching processes described previously. Without a textured surface, light is efficiently extracted from an LED only if its propagation direction within the LED lies inside the angular distribution that permits extraction. This angular distribution is limited, at least in part, by total internal reflection of the light at the surface of the LED's semiconductor layers. Since the refractive index of the LED semiconductor material is relatively high, the angular distribution for extraction becomes relatively narrow. The provision of a textured surface allows for the redistribution of propagation directions for light within the LED, so that a higher fraction of the light may be extracted.

In other embodiments, methods of making wavelength converters and wavelength-converted LEDs are described. The method generally comprises bonding a semiconductor component, such as a wavelength converter, pump LED semiconductor layers, or combination thereof to an adjacent component with a bonding layer comprising polysilazane polymer. For some embodiments, wherein the semiconductor component is a wavelength converter, the adjacent component is typically an inorganic light-transmissive (e.g. glass) cover sheet 245 and/or pump LED semiconductor layers 204. The adjacent component to the wavelength converter may also be another optical element such as a converging extractor, as described in U.S. Pat. No. 7,541,610; incorporated herein by reference. For other embodiments, wherein the semiconductor component is a pump LED, the adjacent component may be a wavelength converter, a lens, a prism, or other optical element such as a converging extractor (such as described in WO 2008/083188; incorporated herein by reference). In either embodiment, the wavelength converted LED comprises pump LED semiconductor layers adjacent to the semiconductor wavelength converter opposing the cover sheet as shown in FIGS. 2 and 3E.

Some exemplary process steps for constructing a wavelength-converted LED device are now described with reference to FIGS. 3A-3E. Pump LED wafer 200 is provided. A pump LED wafer typically comprises LED semiconductor layers 204 over an LED substrate 206, see FIG. 3A. In some embodiments, the LED semiconductor layers 204 are grown directly on the substrate 206, and in other embodiments, the LED semiconductor layers 204 are attached to the substrate 206 via (e.g. metallic solder) bonding layer 216. The upper surface of the LED layers 204 may be a textured surface 212, as illustrated in FIGS. 3A-3E. The wafer 200 is provided with metallized portions 220 that may be used for subsequent wire-bonding. The lower surface of the substrate 206 may be provided with a metallized layer 218. The wafer 200 may be etched to produce mesas 222. A layer of bonding material 210, is disposed over the wafer 200. Such bonding material 210 may comprise polysilazane or may comprise an alternative composition.

Figure 3A:
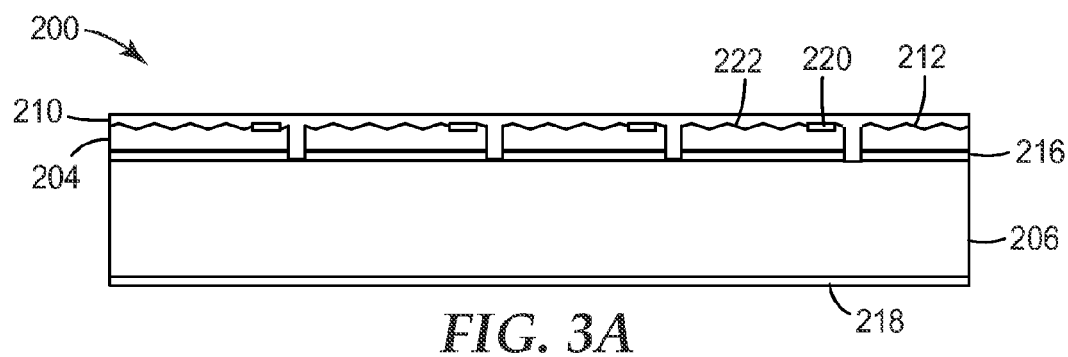
FIGS. 3A-3E schematically illustrate process steps in an embodiment of a manufacturing process for a wavelength converted LED.
Figure 3B:
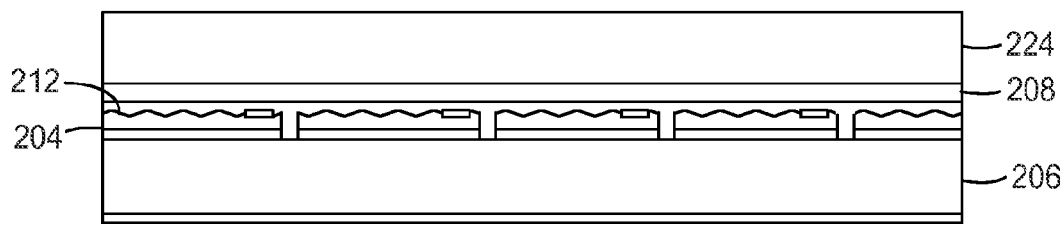

A multilayered semiconductor wavelength converter 208, grown on a converter substrate 224, is attached to the polysilazane bonding layer 210, as shown in FIG. 3B.

The wavelength converter 208 may be attached to the polysilazane bonding layer using any suitable method. For example, a measured quantity of bonding material, such as an adhesive, may be applied to one of the wafers 200, 208 sitting on a room temperature hot plate. The wavelength converter 208 or the LED wafer 200 may be then attached to the bonding layer using any suitable method. For example the flat surfaces of the wafers 200, 200 can then be roughly aligned one on top of the other and a weight having a known mass can be added on top of the wafers 200, 208 to encourage the bonding material to flow to the edges of the wafers. The temperature of the hot plate can then be ramped up and maintained at a suitable temperature for curing the bonding material. The hot plate can then be cooled and the weight removed to provide the glue bonded converter-LED wafer assembly. In another approach, a sheet of a selected tacky polymeric material can be applied to a wafer using a transfer liner that has been die cut to wafer shape. The wafer is then mated to another wafer and the bonding material cured, for example on a hot plate as described above. In another approach, a uniform layer of bonding material may be pre-applied to the surface of the wavelength converter wafer and the exposed surface of the bonding material protected with a removable liner until such time as wafers 200 and 208 are ready to be bonded. In the case of curable bonding materials, it may be desirable to partially cure the bonding material so that it has sufficiently high viscosity and/or mechanical stability for handling while still maintaining its adhesive properties. The partial cure may be accomplished using thermal curing. However, it is preferred that the partial cure is accomplished by photocuring a polysilazane bonding layer further comprising a multi(meth)acrylate monomer.

Figure 3C:
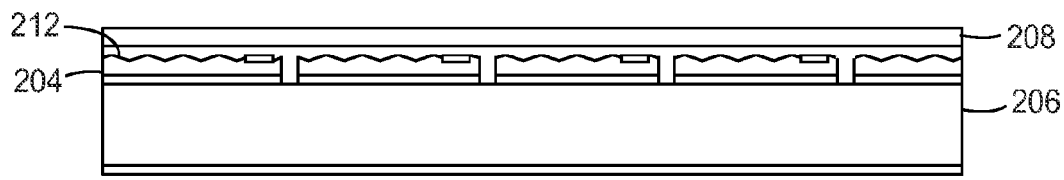

The converter substrate 224 may then be etched away, to produce the bonded wafer structure shown in FIG. 3C.

Figure 3D:
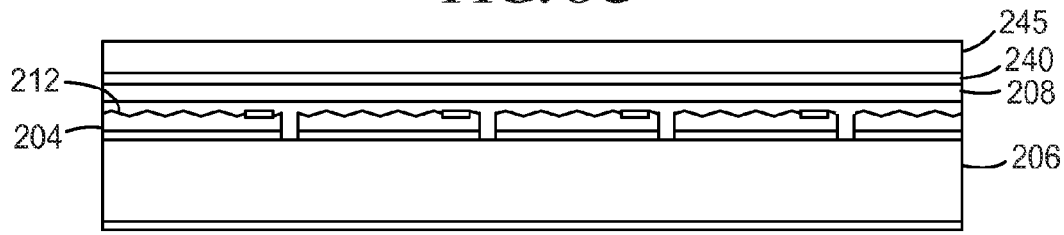
Figure 3E:
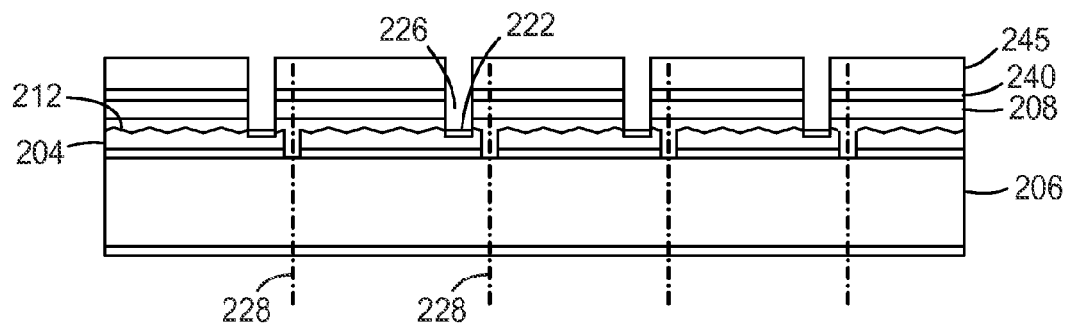

Once the extraction features have been etched, the wavelength converter 208 is bonded to the inorganic light-transmissive (e.g. glass) cover sheet 245 with a bonding layer 240 comprising polysilazane polymer and optional (meth)acrylate monomer, as depicted in FIG. 3D. After properly positioning the inorganic light-transmissive (e.g. glass) cover sheet with respect to the wavelength converter 208, the polysilazane otpical adhesive is cured. In one embodiment, the method comprises thermally curing the polysilazane bonding layer. In another embodiment, the polysilazane composition comprises a free-radically polymerizable (meth)acrylate monomer. The polysilazane optical adhesive is first partially cured by radiation curing to maintaining the positioning of the assembled components, followed by heat curing to complete the curing of the polysilazane polymer.

Vias 226 are then etched through the wavelength converter 208 and the bonding material 210 to expose the metallized portions 220, as shown in FIG. 3E.

For embodiments wherein a plurality of LEDs are fabricated on a common substrate, the method, further comprises (e.g. mechanically) separating the wavelength converted light emitting diodes into individual wavelength converted LED dies. With reference to FIG. 3E, the wafer may then be cut, for example using a wafer saw, at the dashed lines 228 to produce separate wavelength converted LED devices. Other methods may be used for separating individual devices from a wafer, for example laser scribing and water jet scribing. In addition to etching the vias, it may be useful to etch along the cutting lines prior to using the wafer saw or other separation method to reduce the stress on the wavelength converter layer during the cutting step.

In view of the optical clarity and thermal stability properties of the polysilazane optical adhesive described herein, such polysilazane optical adhesive described herein are surmised suitable for use as an optical adhesive for other optical substrates, components, and devices. Since the polysilazane optical adhesive described herein is thermally cured, the components or substrates bonded with such optical adhesive typically have a glass transition temperature substantially greater than the thermal curing temperature. For example, the components, and/or assembly of substrates bonded with such optical adhesive, are typically thermally stable. In favored embodiments, the substrates have a Tg of at least 150° C., or 200° C., or 250° C., or greater. Hence, the optical adhesive is particularly useful for bonding substrates and components that are comprised of one or more inorganic materials, such as in the case of components of electronic illuminated display devices.

EXAMPLES

Polysilazane polymer (PSZ) was obtained from KION Corporation (a unit of Clariant), Huntington Valley, Pa.), under trade designation HTT1880 with a possible structure shown as follows:

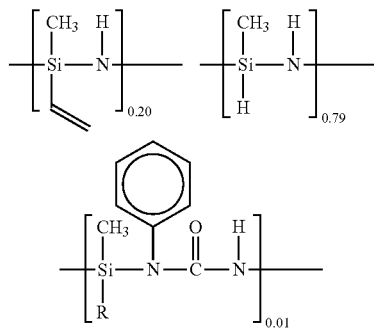

SR351LV is a low viscosity trimethylolpropane triacrylate (TMPTA, Mn: 296) obtained from Sartomer USA, LLC, Exton, Pa. under trade designation SR351LV.
SR444 is a pentaerythritol triacrylate (solvent, 0.1%; water, 0.5%; Mn: 298) obtained from Sartomer USA, LLC, Exton, Pa. under trade designation SR444.
SR295 is a pentaerythritol tetraacrylate; (water, 0.1%; solvent, 0.1%; acid, 0.05%, Mn: 352, m.p. 15-18 C) obtained from Sartomer USA, LLC, Exton, Pa. under trade designation SR295.
SR399LV is a low viscosity dipentaerythritol pentaacrylate (Mn: 525) obtained from Sartomer USA, LLC, Exton, Pa. under trade designation SR399LV.
SR9041 is a pentaacrylate ester (solvent, 0.1%; water, 0.2%; acid, 0.1%) obtained from Sartomer USA, LLC, Exton, Pa. under trade designation SR9041.
DCP is dicumyl peroxide obtained from Aldrich Chemical Company, Milwaukee, Wis. was used as thermal initiator.
DMAP is 2,2-dimethoxy-2-phenylacetophenone obtained from Aldrich Chemical Company, Milwaukee, Wis. (also known as IRGACURE 651) was used as UV initiator.

Example 1

Monochrome platelets consisting of II-VI converting layers bonded to a glass wafer using polysilazane-acrylate blended adhesives were fabricated. The starting substrate consisted of a bottom substrate layer of InP with a GaInAs buffer layer followed by the II-VI converting layers on top and were grown using molecular beam epitaxial (MBE) process, similar to those described in for example in WO2009/048704.

To promote adhesion of the II-VI material to the final LED device, 300 nm of silicon nitride ($Si_3N_4$) and 100 nm of $SiO_2$ were deposited onto the II-VI layer at about 100° C. using plasma enhanced chemical vapor deposition (PECVD) method. Prior to coating the $Si_3N_4$ and $SiO_2$ layers, the surfaces of the II-VI material were reactive ion etched (RIE) with $O_2$ plasma for 120 seconds then by argon plasma for 16 seconds.

The $Si_3N_4$/$SiO_2$ coated side of the II-VI material was bonded to a temporary glass carrier substrate to aid in the removal of the InP substrate and GaInAs buffer layer. To accomplish this, first, the II-VI/InP wafer was cleaved to the desired size and then cleaned using acetone, methanol, and IPA followed by drying using nitrogen gas. The glass carrier substrate was cut to the appropriate size and cleaned using same procedure. A wax powder (ROSS WAX 160, obtained from Frank B. Ross Co., Inc., Rahway, N.J.) was applied to the glass substrate and melted using a hot plate at 205 C. The II-VI sample was placed on the wax and slid around on the glass to remove bubbles. The II-VI/InP wafer and glass were removed from the hotplate and allowed to cool.

Next, the InP substrate was removed in a two step process by roughening and etching the InP layer. Roughening was performed by placing the sample flat in a dish of water and sanding using 500 grit sandpaper until the entire surface had a matte finish. The sample was then cleaned and dried. The InP was etched away by immersing the sample in a 3:1 solution of HCl:$H_2O$ for 50-60 minutes. The sample was rinsed with de-ionized (DI) water and dried using $N_2$ gas.

After the InP was etched away, the InGaAs buffer layer were removed in an acidic solution consisting of adipic acid, DI water, ammonium hydroxide, and hydrogen peroxide. The etch time was about 10 minutes at which time the transparent specular II-VI layer was revealed. The sample was rinsed thoroughly in DI water and dried.

Extraction features to prevent light trapping in the II-VI converting layers were formed on the top layer by patterning square arrays of features having a pitch of 1 micron using a lithography system. The patterns were etched in the II-VI material using HBr:$BR_2$ etchant at an etch time of more than 15 seconds. The etch time was determined by the depth of etching desired. After etching the patterns, the photoresist was removed and the extraction features were coated with 60 nm $Si_3N_4$ using PECVD technique.

The next step was to form platelets by bonding the II-VI converted layers to a 0.5 mm thick glass cover. The adhesive contained polysilazane (HTT 1800), 5 weight % multifunctional acrylate (SR295) blend, and 1 weight % each of two initiators, dicumyl peroxide (DCP) and 2,2 dimethoxy-2 phenol acetphenone (DMAP). The PSZ-acrylate adhesive was prepared using the following sequence: 1) 0.02 grams of the thermal and UV initiators were weighed into a bottle; 2) 0.1 gram of SR295 was added and then 2 grams of PSZ; 3) the composition was placed in a glove box with a nitrogen atmosphere overnight or placed in a 70° C. oven for 10 min to dissolve the UV and thermal initiators; 4) the PSZ solution was outgassed in a vacuum oven (at room temp) for 1.5 hours at 68 kPa vacuum; 5) the bottle containing the mixture was removed from the vacuum oven and placed in a nitrogen atmosphere with the lid open for 5 to 10 minutes; and 6) then the bottle was closed while in the nitrogen environment.

Before bonding, the cover glass for the platelet was cleaned on a spin coater at 3000 rpm using a sequence of sprayed acetone, methanol, and isopropyl alcohol (IPA) while spinning The cover glass was then dried by spinning for another 30 seconds after last solvent rinse. The II-VI sample was cleaned with a quick rinse in acetone, methanol, and IPA and dried in nitrogen.

To bond the II-VI converted layers to the glass cover, one drop of PSZ adhesive was dispensed on a cleaned cover glass with a pipette. The II-VI sample was placed II-VI side down onto the PSZ drop, while applying pressure on the back of temporary carrier glass with tweezers. Excess PSZ around the sample edges was cleaned off with a swab. Curing of the adhesive was initiated by UV exposure of the adhesive from the glass side. (The UV exposure for B-staging the adhesive was accomplished using 5 cycles of 90 sec at 75 mW/cm$^2$ in a flood exposure system, EFOS NOVACURE UV Light Source). To thermally cure the PSZ, the sample was placed platelet-glass side down onto a 120° C. hot plate for 10 min. For the final cure, the hot plate temperature was increased to 170° C. for 60 min.

The temporary carrier glass was slid to the side and removed when the wax softened at 170° C. on the hotplate. The sample was allowed to cool and the temporary wax was removed using acetone.

Before singulating the platelets, the top surface of the II-VI was protected by placing the sample on a 100° C. hotplate and applying a low temperature wax. The sample was flipped over onto a cleanroom wipe and the cover glass surface was cleaned first with an acetone soaked swab and then with an isopropyl alcohol soaked swab. An UV-release dicing tape (Nitto Denko America, Inc., Santa Clara, Calif.) was applied to cover glass surface to provide a carrier for the converter assembly during dicing. The sample was then diced into individual platelets 1.0 mm by 1.0 mm using a Disco model DAD522 dicing saw (Disco Hi-Tech America, Inc., Santa, Clara, Calif.). After dicing, the protective wax layer was removed with acetone, followed by a rinse of methanol and isopropyl alcohol. The dicing tape released from the cover glass after UV flood exposure for 30 sec @ 75 mW/cm$^2$. The diced edges of the adhesive were inspected and revealed no stringing of the polysilazane adhesive.

Example 2

For Example 2 a PSZ (HTT 1800)—5 weight % acrylate adhesive (SR9008) containing 1 weight % each of two initiators, dicumyl peroxide (DCP) and 2,2 dimethoxy-2 phenol acetphenone (DMAP), was prepared using the process described in Example 1.
Color Stability and % Transmission of Examples 1 and 2

For convenience, the following experiments were carried out in air except the curing process.

Approximately 10 microliters of the adhesive of Example 1 and Example 2 were each dispensed on a separate previously cleaned glass slides (2.5 cm×2.5 cm). The glass slides were cleaned in an ultrasonic bath using DI water, acetone and methanol in sequence. The slides and cover slips were then dried by blowing nitrogen gas. A previously cleaned (as described above for glass slides) glass cover slip (1 cm×1 cm) was placed on each glass slide on the adhesive drop and the cover slip were pressed lightly to spread the adhesives. Each slide-adhesive-cover slip was then radiated for 5 minutes with UV light using an EFOS NOVACURE UV Light Source. The intensity of light source at 365 nm was 20 mW/cm$^2$. After the UV exposure (e.g., cure), the slides were then placed in an oven set at 120° C. for 15 minutes and then the temperature of the oven was raised to 170° C. The adhesive was thermally cured at 1 hr at 170° C. and the samples were allowed to cool to room temperature for evaluations.

The cured samples (cured in between glass slides) were aged in an 185° C. oven and monitored by UV-VIS spectroscopy. After 3 weeks of aging at 185° C., Example 1 was clear indicating excellent thermal stability. Example 2 sample was clear but had yellow edges.

The % transmission of Example 1 after 1, 2, and 3 weeks was 91-92% for wavelengths ranging from about 375 nm to 700 nm. The % transmission of Example 2 after 1, 2, and 3 weeks was 91-92% for wavelengths ranging from about 450 nm to 700 nm. The % transmission at a wavelength of 400 nm was about 88%.

Examples 3-8

Various other adhesive comprising a mixture of PSZ (HTT 1800) and various acrylate monomers were prepared using the process described in example 1. The acrylate monomer and concentration thereof is described in the following table:

| Example: | Acrylate used: |
|---|---|
| 3 | 10 wt-% SR295 |
| 4 | 5 wt-% SR399LV |
| 5 | 5 wt-% SR444 |
| 6 | 5 wt-% SR351LV |
| 7 | 5 wt-% SR9041 |
| 8 | 5 wt-% SR9012 |

The % transmission of Example 3 was evaluated in the same manner as previously described. After 4 weeks of aging at 185° C., Example 3 appeared to be thermally stable.

A study of the thermal stability of Examples 1 and 3 was conducted using thermo-gravimetric analysis (TGA). The test results indicated that such adhesives are thermally stable and usable up to about 200° C. or higher.

The % transmission of Example 3 after 5 weeks of aging at 185° C. ranged from 90% to 93% for wavelengths of 400 nm to 700 nm The % transmission of Examples 4-8 after 5 weeks of aging at 185° C. was at least 89% for a wavelength of 400 nm and 91-93% for a wavelength of about 450 nm.

Example 9

For Example 9, a pure PSZ (HTT 1800) sample containing only 1 weight % of the thermal initiator, dicumyl peroxide (DCP) was prepared using the process described in Example 1. Glass slides for aging experiments were prepared using the PSZ adhesive as previously described. The color stability and % transmission were evaluated in the same manner as previously described. After 5 weeks of aging at 185 C, Example 9 showed no visible color change and the % transmission remained stable at 91-92% for wavelengths from 400 nm to 700 nm.

What is claimed is:

1. A semiconductor component comprising a wavelength converter bonded to an adjacent inorganic component with a cured bonding layer comprising a polysilazane polymer.

2. The semiconductor component of claim 1 wherein the wavelength converter is a multilayer semiconductor wavelength converter or an inorganic matrix comprising embedded phosphor particles.

3. The semiconductor component of claim 1 wherein the wavelength converter is a multilayer semiconductor wavelength converter comprising II-VI semiconductor material.

4. The semiconductor component of claim 1 wherein the multilayer semiconductor wavelength converter absorbs a portion of blue light to produce longer wavelengths.

5. The semiconductor component of claim 1 wherein the bonding layer further comprises up to 10 wt-% of free-radically polymerizable monomer.

6. The semiconductor component of claim 5 wherein the free-radically polymerizable monomer is a (meth)acrylate monomer.

7. The semiconductor component of claim 6 wherein the (meth)acrylate monomer is a multi-(meth)acrylate monomer comprising at least three (meth)acrylate groups.

8. The semiconductor component of claim 1 wherein the adjacent component is a cover sheet.

9. A light emitting diode (LED), comprising:
a pump LED component bonded to an adjacent component with a cured bonding layer comprising polysilazane polymer.

10. The light emitting diode (LED) of claim 9 wherein the LED component and adjacent component are comprised of a material which is stable at temperature greater than 150° C.

11. The light emitting diode (LED) of claim 9 wherein the LED component and adjacent component are comprised of one or more inorganic materials.

12. The light emitting diode (LED) of claim 9 wherein the pump LED comprises III-V semiconductor material.

13. The light emitting diode (LED) of claim 9 wherein the adjacent component is a wavelength converter, lens, or prism.

14. The light emitting diode (LED) of claim 13 wherein the wavelength converter is a multilayer semiconductor wavelength converter or an inorganic matrix comprising embedded phosphor particles.

15. The light emitting diode (LED) of claim 9 wherein the light emitting diode (LED) further comprise a cover sheet.

16. The light-emitting diode (LED) of claim 13 where the wavelength converter is bonded to the cover sheet with a cured bonding layer comprising a polysilazane polymer.

17. An electronic illuminated display comprising:
a light-transmissive inorganic component bonded to an adjacent inorganic component with a cured bonding layer comprising a polysilazane polymer.

18. The electronic illuminated display of claim 17 wherein the light-transmissive inorganic component is the light emitting diode (LED) of claim 9.

19. A method of making a semiconductor component comprising:
bonding a wavelength converter wafer, pump LED component, or combination thereof to an adjacent component with a bonding layer comprising polysilazane polymer.

20. The method of claim 19 wherein a wavelength converter is bonded to an inorganic light-transmissive cover sheet.

21. The semiconductor component of claim 1 wherein the polysilazane comprises a linear, branched, or cyclic backbone comprising at least one Si—N linkage and at least one ethylenically unsaturated group or a SiH group.

22. The light emitting diode (LED) of claim 9 wherein the polysilazane comprises a linear, branched, or cyclic backbone comprising at least one Si—N linkage and at least one ethylenically unsaturated group or a SiH group.

23. The electronic illuminated display of claim 17 wherein the polysilazane comprises a linear, branched, or cyclic backbone comprising at least one Si—N linkage and at least one ethylenically unsaturated group or a SiH group.

24. The method of making a semiconductor component of claim 19 wherein the polysilazane comprises a linear, branched, or cyclic backbone comprising at least one Si—N linkage and at least one ethylenically unsaturated group or a SiH group.

* * * * *

UNITED STATES PATENT AND TRADEMARK OFFICE
CERTIFICATE OF CORRECTION

Page 1 of 2

PATENT NO. : 9,041,034 B2
APPLICATION NO. : 13/876373
DATED : May 26, 2015
INVENTOR(S) : Guoping Mao It is certified that error appears in the above-identified patent and that said Letters Patent is hereby corrected as shown below:

On The Title Page, Item (56)

Page 2, Column 2 (Other Publications)
Line 11, Delete "Non-Cyrstalline" and insert -- Non-Crystalline --, therefor.

In the Specification

Column 2
Line 61, Delete "cyan,magenta" and insert -- cyan, magenta --, therefor.

Column 4
Line 31, Delete "less that" and insert -- less than --, therefor.

Column 5
Line 2, Delete "Formula III" and insert -- Formula III, --, therefor.
Line 45, Delete "less that" and insert -- less than --, therefor.

Column 8
Line 43, Delete "the a" and insert -- the --, therefor.
Line 47, Delete "componentn)," and insert -- component), --, therefor.

Column 10
Line 41, Delete "surface" and insert -- Surface --, therefor.

Column 12
Line 48, Delete "otpical" and insert -- optical --, therefor.

Column 14
Line 56, Delete "acetphenone" and insert -- acetophenone --, therefor.

Signed and Sealed this
Twenty-ninth Day of December, 2015

Michelle K. Lee
*Director of the United States Patent and Trademark Office*

CERTIFICATE OF CORRECTION (continued)
U.S. Pat. No. 9,041,034 B2

Column 15
Line 49, Delete "acetphenone" and insert -- acetophenone --, therefor.

Column 16
Line 42, Delete "700 nm" and insert -- 700 nm. --, therefor.

In The Claims

Column 18
Line 1, In Claim 16, delete "light-emitting" and insert -- light emitting --, therefor.